(12) United States Patent
Adachi

(10) Patent No.: US 11,917,824 B2
(45) Date of Patent: Feb. 27, 2024

(54) SEMICONDUCTOR STORAGE DEVICE AND METHOD FOR MANUFACTURING SEMICONDUCTOR STORAGE DEVICE

(71) Applicant: Kioxia Corporation, Tokyo (JP)

(72) Inventor: Takahiro Adachi, Yokkaichi (JP)

(73) Assignee: Kioxia Corporation, Tokyo (JP)

(*) Notice: Subject to any disclaimer, the term of this patent is extended or adjusted under 35 U.S.C. 154(b) by 194 days.

(21) Appl. No.: 17/199,577

(22) Filed: Mar. 12, 2021

(65) Prior Publication Data

US 2022/0059563 A1 Feb. 24, 2022

(30) Foreign Application Priority Data

Aug. 20, 2020 (JP) ................... 2020-139687

(51) Int. Cl.
*H10B 43/27* (2023.01)
*H10B 41/10* (2023.01)
*H10B 41/27* (2023.01)
*H10B 43/10* (2023.01)

(52) U.S. Cl.
CPC ............ *H10B 43/27* (2023.02); *H10B 41/10* (2023.02); *H10B 41/27* (2023.02); *H10B 43/10* (2023.02)

(58) Field of Classification Search
CPC ........ H10B 43/27; H10B 41/27; H10B 41/10; H10B 43/10; H10B 43/40; H10B 43/50; H10B 41/30; H10B 43/30; H01L 27/11582; H01L 27/11556; H01L 27/11587; H01L 27/11565; H01L 27/11519; H01L 27/11568; H01L 27/11521; H01L 27/11573; H01L 27/11575
See application file for complete search history.

(56) References Cited

U.S. PATENT DOCUMENTS

| | | | |
|---|---|---|---|
| 6,294,423 B1 | 9/2001 | Malik et al. | |
| 9,646,933 B2 | 5/2017 | Saito et al. | |
| 9,806,093 B2 | 10/2017 | Toyama et al. | |
| 9,818,693 B2 | 11/2017 | Toyama et al. | |
| 9,818,759 B2 | 11/2017 | Kai et al. | |
| 10,038,006 B2 | 7/2018 | Furihata et al. | |
| 10,103,169 B1* | 10/2018 | Ge | H10B 43/10 |
| 10,192,880 B2 | 1/2019 | Lee | |
| 10,381,371 B2 | 8/2019 | Ogawa et al. | |
| 10,510,770 B2 | 12/2019 | Harada et al. | |
| 10,522,228 B2 | 12/2019 | Tanaka | |
| 10,553,602 B2 | 2/2020 | Lee | |
| 10,566,345 B2 | 2/2020 | Kanamori et al. | |

(Continued)

FOREIGN PATENT DOCUMENTS

| | | |
|---|---|---|
| CN | 108377660 A | 8/2018 |
| CN | 109755249 A | 5/2019 |

(Continued)

*Primary Examiner* — Ajay Ojha
*Assistant Examiner* — David Paul Sedorook
(74) *Attorney, Agent, or Firm* — Oblon, McClelland, Maier & Neustadt, L.L.P.

(57) ABSTRACT

A semiconductor storage device of an embodiment includes: a plurality of columnar bodies that penetrate a predetermined film; and a beam that reaches a predetermined depth of the predetermined film shallower than depths of the plurality of columnar bodies and couples the plurality of columnar bodies together with a width smaller than widths of the plurality of columnar bodies.

3 Claims, 5 Drawing Sheets

(56) References Cited

U.S. PATENT DOCUMENTS

| | | | |
|---|---|---|---|
| 10,797,144 B2 | 10/2020 | Ishiduki et al. | |
| 2013/0334488 A1* | 12/2013 | Park | H10B 63/80 |
| | | | 257/4 |
| 2015/0076580 A1* | 3/2015 | Pachamuthu | H10B 41/20 |
| | | | 257/314 |
| 2016/0035742 A1* | 2/2016 | Kanakamedala | H10B 43/35 |
| | | | 438/264 |
| 2016/0240374 A1* | 8/2016 | Kasai | H01L 21/02315 |
| 2017/0062345 A1 | 3/2017 | Saito et al. | |
| 2017/0179026 A1 | 6/2017 | Toyama et al. | |
| 2017/0179151 A1 | 6/2017 | Kai et al. | |
| 2017/0179152 A1 | 6/2017 | Toyama et al. | |
| 2017/0179153 A1 | 6/2017 | Ogawa et al. | |
| 2017/0179154 A1 | 6/2017 | Furihata et al. | |
| 2018/0130814 A1 | 5/2018 | Lee | |
| 2018/0247949 A1* | 8/2018 | Choi | H10B 41/27 |
| 2019/0115356 A1 | 4/2019 | Lee | |
| 2019/0139979 A1 | 5/2019 | Kanamori et al. | |
| 2019/0280004 A1* | 9/2019 | Takamura | H10B 43/10 |
| 2020/0075618 A1* | 3/2020 | Oike | H01L 21/76831 |
| 2020/0161330 A1 | 5/2020 | Kanamori et al. | |
| 2020/0212059 A1* | 7/2020 | Nishikawa | H10B 41/35 |
| 2020/0295026 A1 | 9/2020 | Oike | |

FOREIGN PATENT DOCUMENTS

| | | |
|---|---|---|
| JP | 2018-157103 A | 10/2018 |
| JP | 2019-161042 A | 9/2019 |
| JP | 2019-169568 A | 10/2019 |
| JP | 2020-35932 A | 3/2020 |
| JP | 2020-513224 A | 5/2020 |
| TW | 201719810 A | 6/2017 |
| TW | 201830670 A | 8/2018 |

* cited by examiner

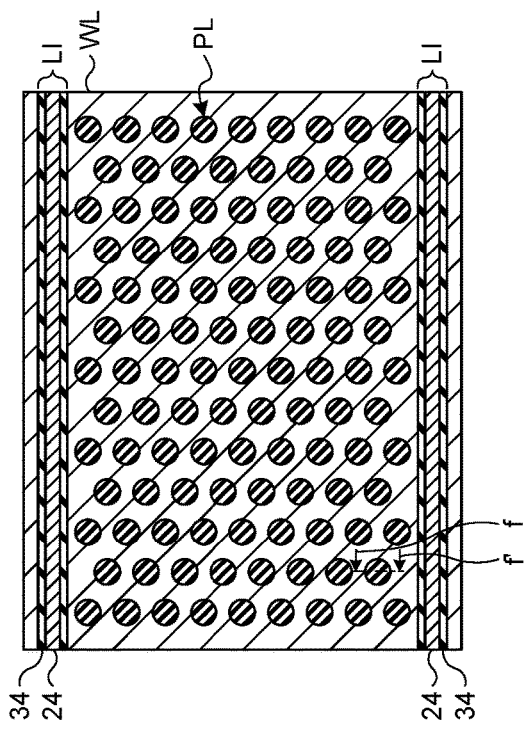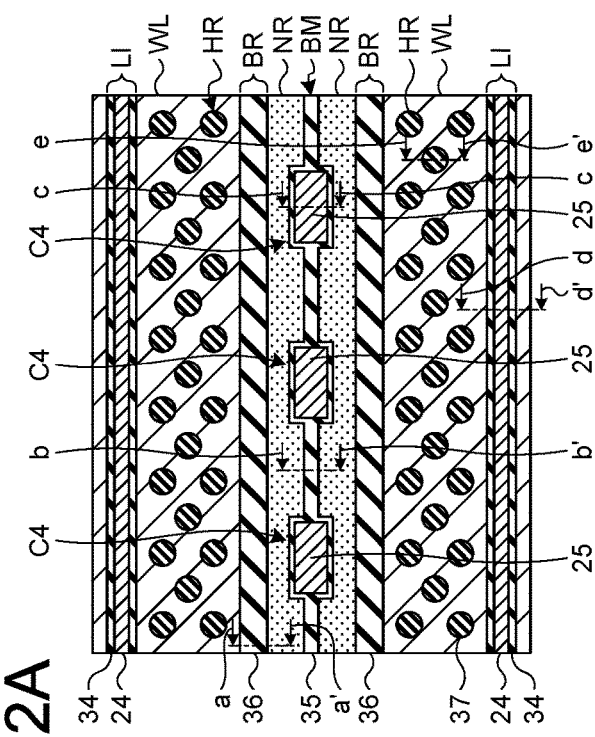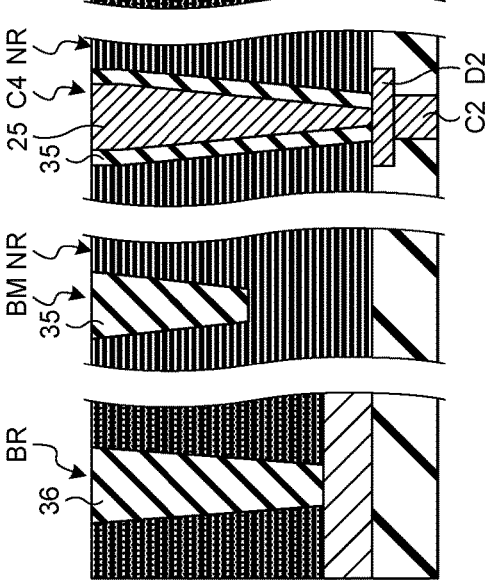

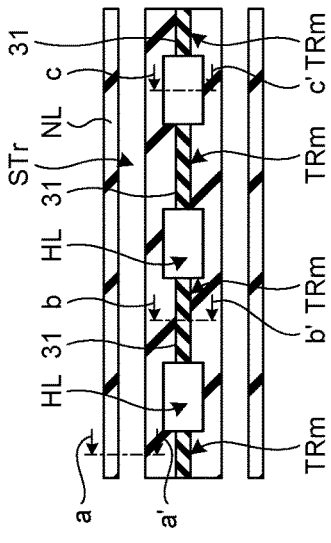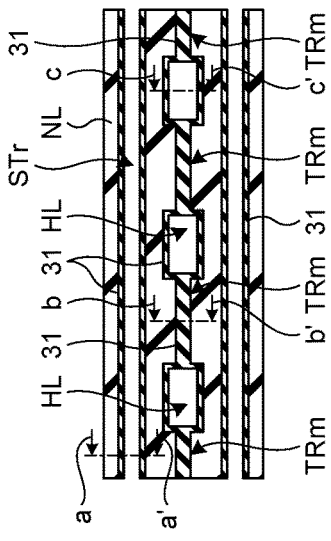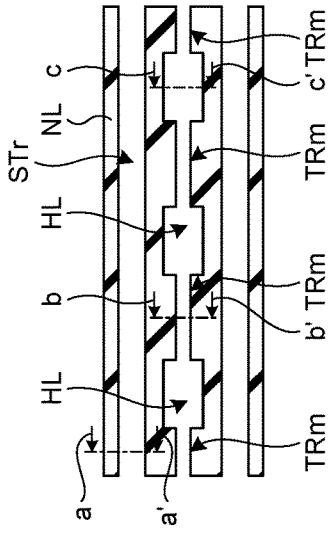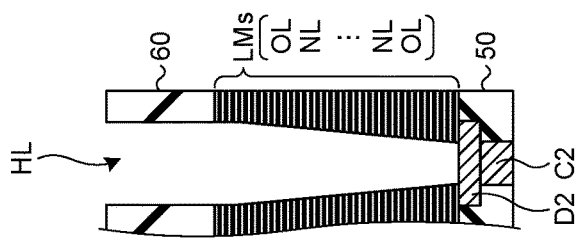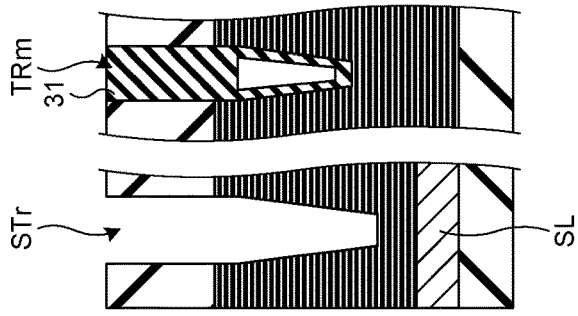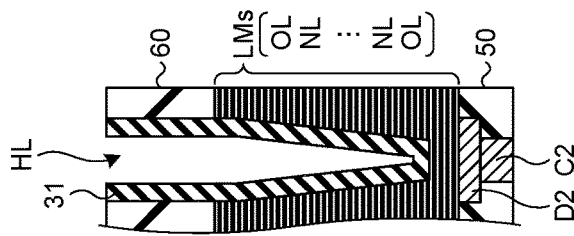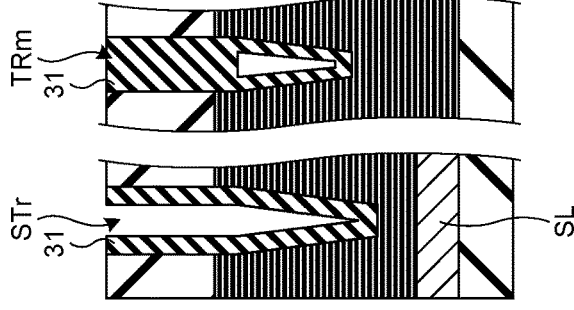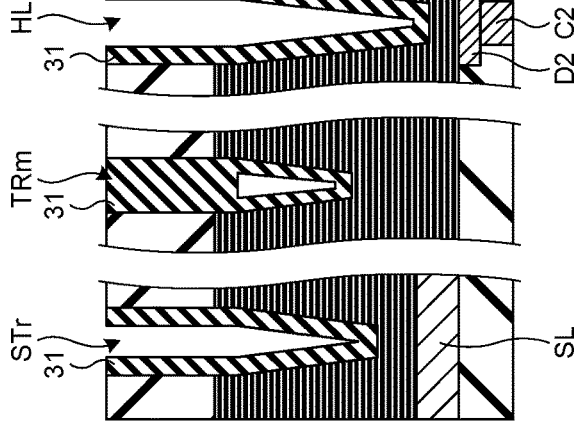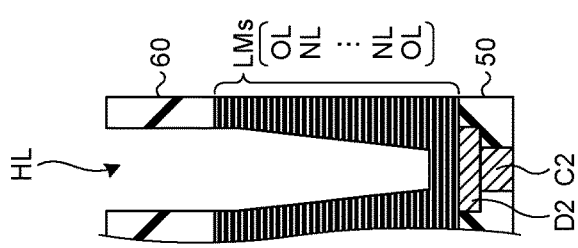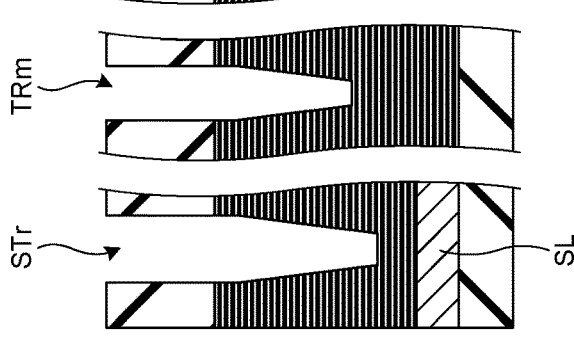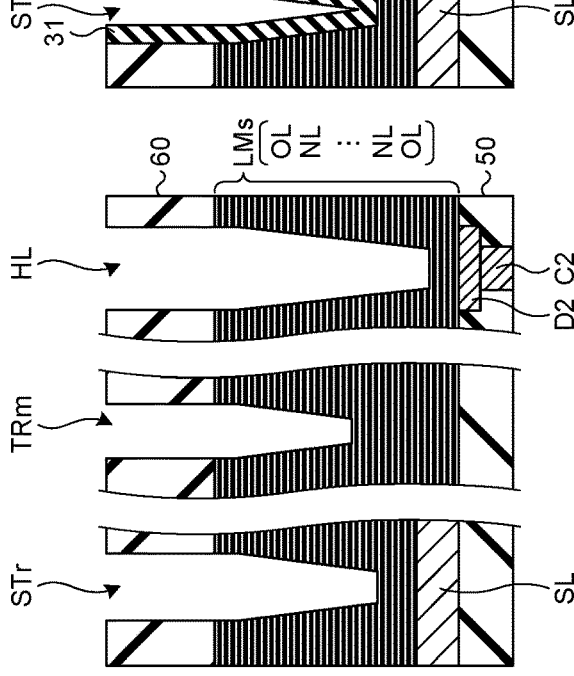

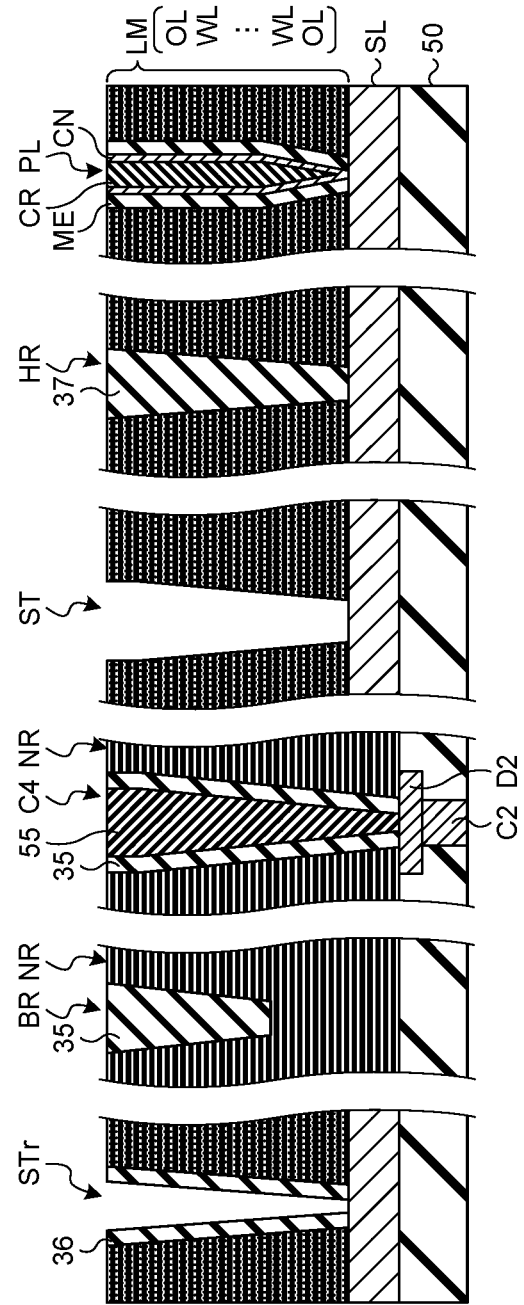

SEMICONDUCTOR STORAGE DEVICE AND METHOD FOR MANUFACTURING SEMICONDUCTOR STORAGE DEVICE

CROSS-REFERENCE TO RELATED APPLICATIONS

This application is based upon and claims the benefit of priority from Japanese Patent Application No. 2020-139687, filed on Aug. 20, 2020; the entire contents of which are incorporated herein by reference.

FIELD

Embodiments described herein relate generally to a semiconductor storage device and a method for manufacturing the semiconductor storage device.

BACKGROUND

There is a semiconductor storage device provided with a columnar body penetrating a predetermined film, such as a contact that connects upper-layer wiring and lower-layer wiring. In order for the columnar body to reliably penetrate the predetermined film, in the design stage of the semiconductor storage device, the cross-sectional area of the columnar body may be increased such that the aspect ratio of the columnar body is less than a predetermined value. This increases the size of the semiconductor storage device.

BRIEF DESCRIPTION OF THE DRAWINGS

FIGS. 2A to 2H are views illustrating a detailed configuration example of the semiconductor storage device according to the embodiment;

FIGS. 3Aa, 3Ac to 3Ae, 3Ba, 3Bc to 3Be, 3Ca, and 3Cc to 3Ce are views illustrating an example of a procedure of a method for manufacturing the semiconductor storage device according to an embodiment;

FIGS. 4C to 4H are views illustrating an example of a procedure of the method for manufacturing the semiconductor storage device according to the embodiment.

DETAILED DESCRIPTION

A semiconductor storage device of an embodiment includes: a plurality of columnar bodies that penetrate a predetermined film; and a beam that reaches a predetermined depth of the predetermined film shallower than depths of the plurality of columnar bodies and couples the plurality of columnar bodies together with a width smaller than widths of the plurality of columnar bodies.

Hereinafter, the present invention will be described in detail with reference to the drawings. Note that the present invention is not limited by the following embodiments. In addition, the components in the following embodiment include those that can be easily assumed by a person skilled in the art or those that are substantially the same.

(Configuration Example of Semiconductor Storage Device)

Figure 1A:
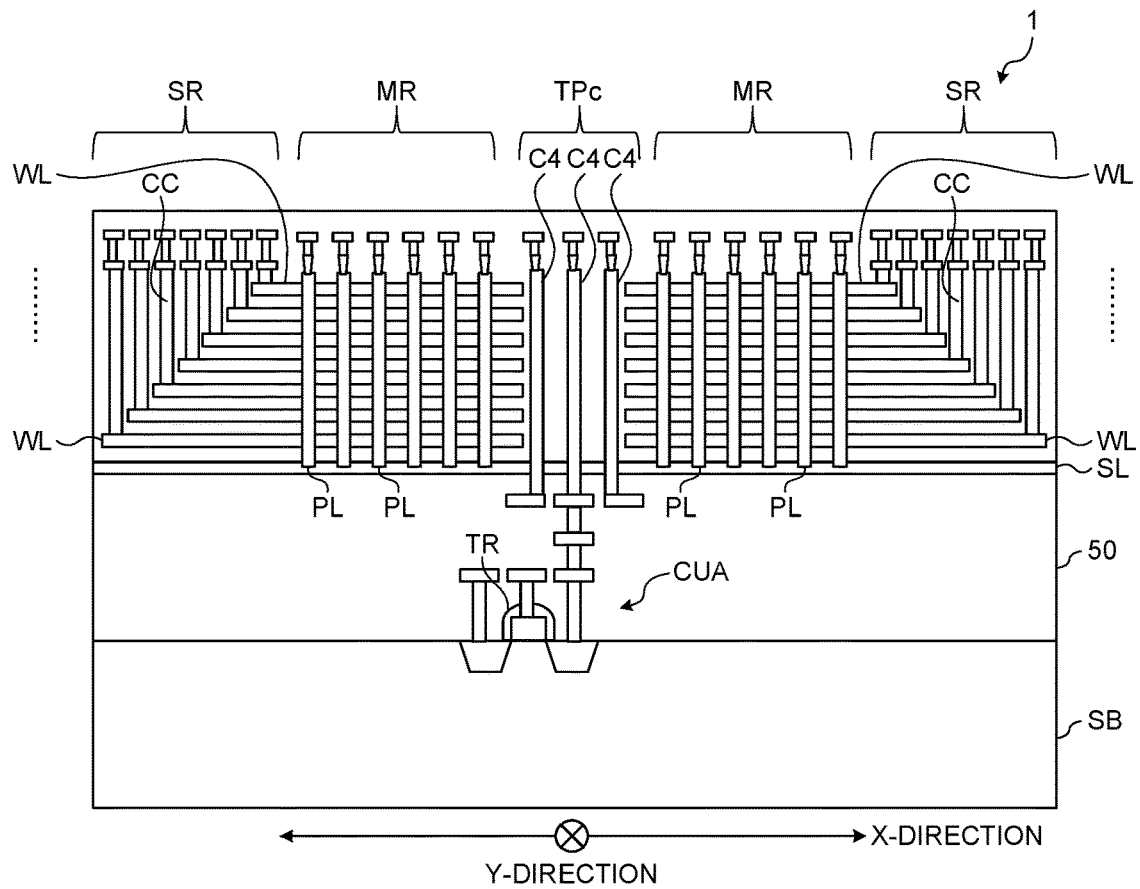
FIGS. 1A and 1B are views illustrating a schematic configuration example of a semiconductor storage device according to an embodiment.
Figure 1B:
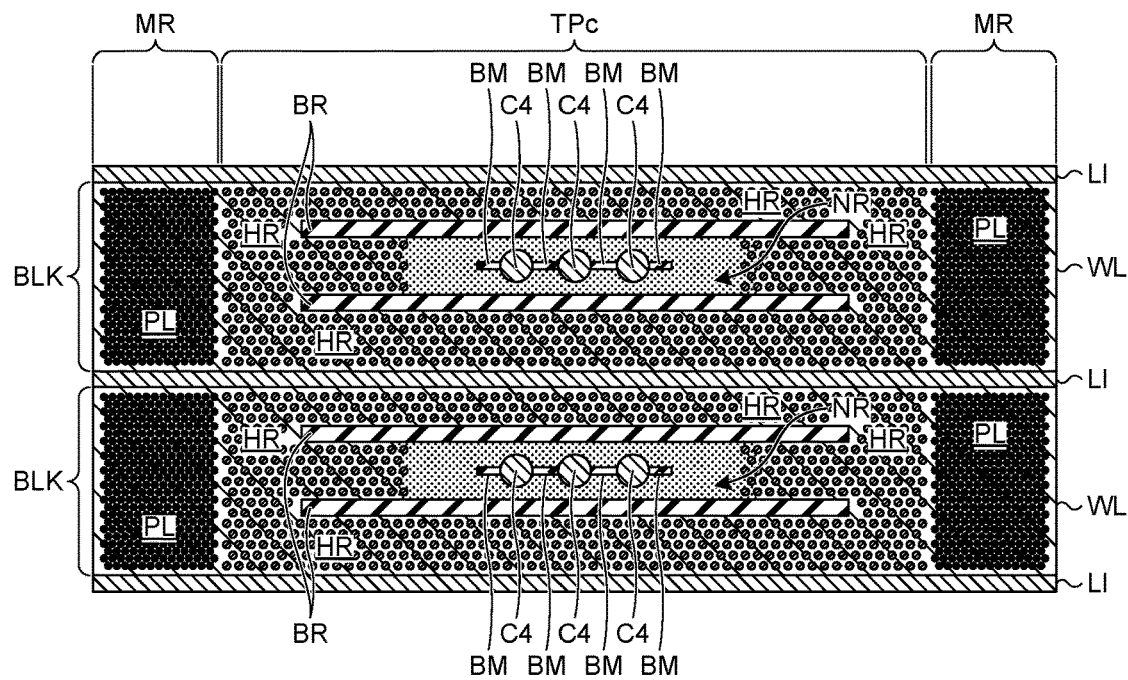

FIGS. 1A and 1B are views illustrating a schematic configuration example of a semiconductor storage device 1 according to the embodiment. FIG. 1A is a schematic sectional view along the X-direction, illustrating the overall configuration of the semiconductor storage device 1, and FIG. 1B is a transverse sectional view of the semiconductor storage device 1.

As illustrated in FIGS. 1A and 1B, the semiconductor storage device 1 includes a peripheral circuit CUA, a memory region MR, a through contact region TPc, and a staircase region SR on a substrate SB.

The substrate SB is, for example, a semiconductor substrate such as a silicon substrate. The peripheral circuit CUA including a transistor TR, wiring, and the like is disposed on the substrate SB. The peripheral circuit CUA contributes to an operation of a memory cell to be described later.

The peripheral circuit CUA is covered with an insulating layer 50. A source line SL is disposed on the insulating layer 50. A plurality of word lines WL are stacked on the source line SL.

The plurality of word lines WL are divided in the Y-direction by the plurality of contacts LI. That is, each of the plurality of contacts LI has a longitudinal direction in the X-direction along the surface of the word line WL and penetrates the word line WL in a stacking direction.

The memory region MR, the through contact region TPc, and the staircase region SR disposed at each end of the word line WL are disposed between the plurality of contacts LI. The configuration of these between the plurality of contact LIs is referred to as a block BLK.

In the memory region MR, a plurality of pillars PL penetrating the word lines WL in the stacking direction are arranged in a matrix. A plurality of memory cells are formed at intersections of the pillar PL and the word line WL. Thus, the semiconductor storage device 1 is configured as a three-dimensional nonvolatile memory in which, for example, memory cells are three-dimensionally arranged in the memory region MR. A plug for connecting the pillar PL and upper-layer wiring, such as a bit line, is disposed at the upper end of the pillar PL.

The staircase region SR has a configuration in which the plurality of word lines WL are extracted stepwise. A contact CC for connecting the word line WL and the upper-layer wiring and the like is disposed at a terrace portion of each of the plurality of word lines WL extracted stepwise. In the present specification, a direction in which the terrace surface of each stage of the staircase region SR faces is oriented is defined as the upward direction.

The through contact region TPc has an insulating region NR as a predetermined film sandwiched between two barrier layers BR arranged in the Y-direction. Each of the barrier layers BR has a longitudinal direction in the X-direction and penetrates the word line WL in the stacking direction. Blocked by the barrier layer BR, the word line WL is and is not disposed in the insulating region NR. In the insulating region NR, a plurality of contacts C4 for connecting the peripheral circuit CUA disposed on the lower substrate SB and various types of upper-layer wiring are arranged, for example, in the X-direction as a first direction.

A beam BM for coupling the plurality of contacts C4 together is disposed between the plurality of contacts C4 as a plurality of columnar bodies. The beam BM has a width smaller than the width of the contact C4 in the Y-direction and extends in the X-direction by coupling together the plurality of contacts C4 arranged in the X-direction, for example. The beam BM may also be disposed outside the contact C4 at the end in the X-direction.

In a region of the through contact region TPc excluding the insulating region NR, a plurality of columnar portions HR penetrating the word line WL in the stacking direction are arranged in a matrix. The columnar portion HR is also disposed in the staircase region SR. The columnar portion HR functions as a support for supporting the semiconductor storage device 1 in the manufacturing process for the semiconductor storage device 1.

Next, a detailed configuration example of the semiconductor storage device 1 will be described with reference to FIGS. 2A to 2H. FIGS. 2A to 2H are views illustrating the detailed configuration example of the semiconductor storage device 1 according to the embodiment.

FIG. 2A is a transverse sectional view of the through contact region TPc along a plane of a predetermined word line WL. FIG. 2B is a transverse sectional view of the memory region MR along the plane of the predetermined word line WL.

FIG. 2C is a longitudinal sectional view of the barrier layer BR along line a-a' of FIG. 2A. FIG. 2D is a longitudinal sectional view of the beam BM along line b-b' of FIG. 2A. FIG. 2E is a longitudinal sectional view of the contact C4 along line c-c' of FIG. 2A. FIG. 2F is a longitudinal sectional view of the contact LI along line d-d' line of FIG. 2A. FIG. 2G is a longitudinal sectional view of the columnar portion HR along line e-e' of FIG. 2A. FIG. 2H is a longitudinal sectional view of the pillar PL along line f-f' of FIG. 2B.

However, in FIGS. 2C to 2H, the structure below the insulating layer 50 such as the substrate SB and the peripheral circuit CUA, the upper-layer wiring, and the like are omitted.

As illustrated in FIGS. 2A to 2H, the semiconductor storage device 1 includes a stacked body LM disposed on the source line SL, such as a polysilicon layer.

The stacked body LM as the second stacked body has a configuration in which a plurality of word lines WL as a first conductive layer, such as a tungsten layer or a molybdenum layer, and a plurality of insulating layers OL as a second insulating layer, such as a $SiO_2$ layer, are alternately stacked one by one.

The stacked body LM includes: the memory region MR in which a plurality of memory cells are three-dimensionally disposed; the staircase region SR (cf. FIG. 1A) in which the word lines WL in the respective layers are formed stepwise at each end of the stacked body LM; and the through contact region TPc in which the plurality of contacts C4 and the beam BM that connects the contacts C4 are disposed. In the through contact region TPc, the stacked body LM surrounds the insulating region NR. The insulating region NR has a stacking structure as a first stacked body in which a plurality of insulating layers of different kinds, such as SiN layers and $SiO_2$ layers, are stacked alternately. That is, the word line WL is not disposed in the insulating region NR.

The barrier layer BR as a first plate-like portion has a longitudinal direction in the X-direction and has a width in the Y-direction substantially equal to the width of the contact LI in the Y-direction, for example. The barrier layer BR penetrates the stacked body LM so as to come into contact with the insulating region NR and reaches the source line SL in contact with the insulating region NR. Thus, the barrier layer BR separates the insulating region NR from the stacked body LM surrounding the insulating region NR at least in the Y-direction. The inside of the barrier layer BR is filled with an insulating layer 36 such as a $SiO_2$ layer.

The beam BM extends in the insulating region NR in the X-direction and also extends in the depth direction of the insulating region NR. However, the beam BM does not penetrate the stacking structure of the insulating region NR, and the bottom of the beam BM is located at a position shallower than the bottom of the contact C4 to be described later, for example. The width of the beam BM in the Y-direction is smaller than the widths of the barrier layer BR and the contact LI in the Y-direction. The inside of the beam BM is filled with an insulating layer 35 as a third insulating layer such as a $SiO_2$ layer.

The contact C4 as the columnar body has a shape such as a cylinder, an elliptic cylinder, or a polygonal cylinder, and at least the width of the contact C4 in the Y-direction is 1.3 times larger than the width of the contact LI in the Y-direction, for example. The contact C4 penetrates the stacking structure of the insulating region NR and is connected to wiring D2 disposed in the insulating layer 50 below the source line SL. The wiring D2 is electrically connected to the transistor TR of the peripheral circuit CUA via a plurality of contacts including the contact C2 and another wiring.

The contact C4 includes the insulating layer 35 such as a $SiO_2$ layer covering the sidewall of the contact C4, and a conductive layer 25 such as a tungsten layer filled inside the insulating layer 35. As a result, the contact C4 electrically connects the lower-layer wiring D2 of the stacked body LM and the upper-layer wiring.

By the contact C4 being disposed in the insulating region NR not having the word line WL, the contact C4 is prevented from being electrically connected to the word line WL or the like. By the sidewall of the contact C4 being covered with the insulating layer 35, leakage current or the like is prevented from being generated between the plurality of contacts C4 is suppressed. Since the inside of the beam BM coupling the plurality of contacts C4 together is filled with the insulating layer 35, the beam BM does not affect the insulating performance between the plurality of contacts C4.

The contact LI as the second plate-like portion has a longitudinal direction in the X-direction and penetrates the stacked body LM to reach the source line SL. Thus, the plurality of contacts LI divide the stacked body LM in the Y-direction.

The contact LI includes the insulating layer 34 such as a $SiO_2$ layer covering the sidewall of the contact LI, and the conductive layer 24 such as a tungsten layer filled inside the insulating layer 34. Thus, the contact LI is electrically connected to the source line SL and functions as a source line contact.

The columnar portion HR has a shape of, for example, a cylinder or an elliptical cylinder and through the stacked body LM reaches the source line SL in the through contact region TPc and the staircase region SR. The inside of the columnar portion HR is filled with an insulating layer 37 such as a $SiO_2$ layer.

The pillar PL has a shape of, for example, a cylinder or an elliptic cylinder and penetrates the stacked body LM to reach the source line SL. The pillar PL includes a memory layer ME, a channel layer CN, and a core layer CR in this order from the outer peripheral side. The memory layer ME is a layer in which a block insulating layer, a charge accumulation layer, and a tunnel insulating layer (not illustrated) are stacked in this order from the outer peripheral side of the pillar PL. The channel layer CN is also disposed on the bottom surface of the pillar PL.

The block insulating layer, the tunnel insulating layer, and the core layer CR are, for example, $SiO_2$ layers. The charge accumulation layer is, for example, a SiN layer. The channel layer CN is, for example, an amorphous silicon layer or a polysilicon layer.

With these configurations, a plurality of memory cells arranged in the height direction of each pillar PL are formed at the intersections of the pillar PL and the plurality of word lines WL. The memory cell holds data by accumulation of charges in the charge accumulation layer or by some other way. A predetermined voltage is applied from a predetermined word line WL to a memory cell at a height position of the word line WL, whereby data is written into and read from the memory cell.

(Method for Manufacturing Semiconductor Storage Device)

Next, with reference to FIGS. 3Aa, 3Ac to 3Ae, 3Ba, 3Bc to 3Be, 3Ca, 3Cc to 3Ce, and 4C to 4H, an example of a method for manufacturing the semiconductor storage device 1 of the embodiment will be described. FIGS. 3Aa, 3Ac to 3Ae, 3Ba, 3Bc to 3Be, 3Ca, 3Cc to 3Ce, and 4C to 4H are views illustrating an example of the procedure of the method for manufacturing the semiconductor storage device 1 according to the embodiment.

FIGS. 3A to 3C illustrate how the process is advanced sequentially. The figures of FIGS. 3A to 3C added with "a" are partial transverse sectional views of the through contact region TPc in the process, and the respective figures added with "c" to "e" are longitudinal sectional views along line a-a', line b-b', and line c-c', respectively, in each of the figures added with "a". That is, the respective figures of each of FIGS. 3A to 3C added with "c" to "e" correspond to FIGS. 2C to 2E described above.

FIGS. 4C to 4H are longitudinal sectional views corresponding to FIGS. 2C to 2H described above in one process.

In the method for manufacturing the semiconductor storage device 1, first, the peripheral circuit CUA including the transistor TR is formed on the substrate SB. A plurality of contacts and a plurality of wirings are formed while the peripheral circuit CUA is covered with the insulating layer 50, and the contact C2 and the wiring D2 are formed on the uppermost layer. The source line SL is formed in these configurations.

A stacked body LMs is formed on the source line SL, and a plurality of pillars PL and a plurality of columnar portions HR penetrating the stacked body LMs are formed.

As illustrated in FIGS. 3Aa and 3Ac to 3Ae, the stacked body LMs as a first stacked body has a structure in which a plurality of insulating layers NL as a first insulating layer such as a SiN layer and an insulating layer OL as a second insulating layer such as a SiO$_2$ layer are alternately stacked one by one. The substantially entire insulating layer NL functions as a sacrificial layer that is later replaced with a conductive material or the like and serves as a word line WL.

On the stacked body LMs, a mask layer 60, such as a carbon layer, having a pattern of the barrier layer BR, the beam BM, and the contacts C4 and LI is formed, and etching processing is performed on the stacked body LMs to a predetermined depth. The carbon layer is a layer mainly composed of carbon formed by a chemical vapor deposition (CVD) method or a spin coating method.

As a result, a slit STr to which the pattern of the barrier layer BR has been transferred, a groove TRm to which the pattern of the beam BM has been transferred, a hole HL to which the pattern of the contact C4 has been transferred, and a slit (not illustrated) to which the pattern of the contact LI has been transferred are formed in the stacked body LMs.

Note that the slit to which the pattern of the contact LI has been transferred and the slit STr to which the pattern of the barrier layer BR has been transferred have substantially the same configuration, and these slits are subjected to substantially the same process in FIGS. 3A to 3C. Thus, FIGS. 3A to 3C illustrate only the slit STr by way of example.

At least the width of the hole HL in the Y-direction is larger than the width of the slit STr in the Y-direction. The groove TRm is communicated with the hole HL. Thus, the apparent aspect ratio of the hole HL is lowered, and the etching rate is improved. Hence the depth reached by the hole HL in the stacked body LMs is at a position deeper than the slit STr, for example.

The width of the groove TRm in the Y-direction is smaller than the width of the slit STr in the Y-direction. Thus, the aspect ratio of the groove TRm is higher than that of the slit STr, the etching rate is lowered, and the depth reached by the groove TRm in the stacked body LMs is at a position shallower than that of the slit STr, for example.

As illustrated in FIGS. 3Ba and 3Bc to 3Be, a carbon layer 31 as a sidewall layer is formed to a predetermined thickness on the sidewalls of the slit STr, the groove TRm, and the hole HL. Thereby, at least the upper portion of the groove TRm having a small width in the Y-direction is closed by the carbon layer 31.

As illustrated in FIG. 3Ca and FIGS. 3Cc-3Ce, the etching processing for the stacked body LMs is resumed. As a result, in the slit STr, the carbon layer 31 is substantially removed, and the bottom of the slit STr reaches the source line SL. In the hole HL, the carbon layer 31 is substantially removed, and the bottom of the hole HL reaches the wiring D2. On the other hand, with the groove TRm being closed by the carbon layer 31, the etching does not progress further in the groove TRm, and the depth reached by the groove TRm in the stacked body LMs does not substantially change.

Desirably, the etching of the slit STr and the etching of the hole HL are completed at substantially the same time. This is to prevent the over-etching amount of one etching from becoming excessive or the throughput from decreasing while the completion of the other etching is waited for. However, generally, the hole HL alone has a high aspect ratio, and the etching rate is lower than that of the slit STr, which has a low aspect ratio and is easily subjected to the etching processing.

Therefore, in the semiconductor storage device 1 of the embodiment, the groove TRm is communicated with the hole HL to reduce the apparent aspect ratio. At this time, it is preferable to adjust the etching rate of the hole HL to be slightly higher than the etching rate of the slit STr, considering that the etching depth of the hole HL is increased by, for example, about 1 μm more than that of the slit STr so as to cause the hole HL to reach the wiring D2 of a lower layer as compared to the slit STr, the depth reached by which is on the source line SL. For this purpose, for example, the width of the hole HL in the Y-direction is preferably set to about 1.3 times the width of the slit STr in the Y-direction.

On the other hand, the width of the groove TRm communicated with the hole HL in the Y-direction is preferably adjusted such that the groove TRm can be blocked by the carbon layer 31, for example, so as not to penetrate the stacked body LMs. This is to prevent the groove TRm from interfering with the structure of the lower layer by penetrating the stacked body LMs. Therefore, the width of the groove TRm in the Y-direction is preferably smaller than, for example, the width of the slit STr in the Y-direction.

After the completion of the etching processing for the stacked body LMs, the mask layer 60 and the carbon layer 31 are removed by ashing.

As illustrated in FIGS. 4C to 4H, the sidewall of the slit STr is covered with the insulating layer 36. The inside of the groove TRm is filled with the insulating layer 35 to form the beam BM. At this time, the insulating layer 35 is also formed on the sidewall of the hole HL. The inside of the insulating layer 35 formed in the hole HL is filled with a sacrificial layer 55. The sacrificial layer 55 is an amorphous silicon layer or the like, which is later replaced with the conductive layer 25.

A removal liquid for the insulating layer NL is infiltrated into the stacked body LMs via the slit ST to serve as the contact LI, thereby removing the insulating layer NL. At this time, the stacked body LMs comes into a fragile state, having a gap between the insulating layers OL from which the insulating layer NL is removed. The pillar PL functions as a support for supporting the stacked body LMs in the memory region MR. The columnar portion HR functions as a support for supporting the stacked body LMs in the through contact region TPc and the staircase region SR.

Note that the removal liquid entering from the slit ST is blocked by the slit STr having the insulating layer 36 and does not reach the region between the 2 slits STr. In other words, the process of removing the insulating layer NL is completed before the removal liquid enters the region between the slits STr from the X-direction side. As a result, the insulating layer NL remains in the stacked body LMs between the two slits STr without being removed.

The stacked body LMs is filled with a conductive material gas via the slit ST to fill the gap from which the insulating layer NL has been removed. Thus, the word line WL is formed in the gap, and the stacked body LM is formed where a plurality of word lines WL and a plurality of insulating layers OL are stacked alternately. However, with the insulating layer NL remaining in the stacked body LMs between the two slits STr, the word line WL is not formed. As thus described, the insulating region NR is formed by the stacked body LMs as the first stacked body maintained between the slits STr.

The process of replacing the insulating layer NL of the stacked body LMs with the word line WL to form the stacked body LM as described above may be referred to as a replacement process.

Thereafter, the inside of the slit STr is filled with the insulating layer 36 to form the barrier layer BR. The sacrificial layer 55 in the hole HL is removed, and the insulating layer 35 is filled with the conductive layer 25 to form a contact C4. The insulating layer 34 is formed on the sidewall of the slit ST, and the inside of the insulating layer 34 is filled with the conductive layer 24 to form the contact LI. The upper-layer wiring is connected to the contacts C4 and LI and the pillar PL via a plug or the like.

As described above, the semiconductor storage device 1 of the embodiment is manufactured.

(Summary)

In a manufacturing process for a semiconductor storage device, for example, a contact may be formed to connect upper-layer wiring, lower-layer wiring across a predetermined film, and the like. In order for the contact to reliably penetrate the predetermined film, the transverse cross-sectional area of the contact may be set to be slightly larger than the area required for the electrical characteristics. Thus, at the time of forming a contact hole for forming the contact in the predetermined film by etching, the aspect ratio of the contact hole is lowered, and the predetermined film can be formed reliably.

Further, in a semiconductor storage device such as a three-dimensional nonvolatile memory, for example, a slit for a replacement process, a slit to serve as a barrier for maintaining an insulating region in a through contact region, and the contact hole for forming the contact that connects the upper-layer wiring and the lower-layer wiring may be formed collectively by etching. In such a case, the etching rate of the contact hole, which tends to have a high aspect ratio, may be decreased, or the etching stop, in which etching does not progress further, may occur in the slit that has a low aspect ratio and is easily subjected to the etching processing.

Therefore, a design to increase the transverse cross-sectional area of the contact hole becomes even more important. For example, in a case where a cylindrical contact is formed, the diameter of the contact hole is set to about three times the width of the slit in the short direction.

However, when the transverse cross-sectional area of the contact hole is increased, the size of the semiconductor storage device may increase.

According to the method for manufacturing the semiconductor storage device 1 of the embodiment, the groove TRm for connecting a plurality of holes HL is formed with a width smaller than that of the plurality of holes HL. Thus, the apparent aspect ratio of the hole HL is reduced without increasing the cross-sectional area of the hole HL, and the contact C4 penetrating the stacked body LMs can be formed more reliably. Also, even in a case where the slits ST and STr and the hole HL are collectively processed, the width of the hole HL in the Y-direction can be held as low as 1.3 times or less of the widths of the slits ST and STr in the Y-direction.

According to the method for manufacturing the semiconductor storage device 1 of the embodiment, the carbon layer 31, which is formed by the CVD method or the spin coating method, is formed on the sidewalls of the plurality of holes HL and the sidewall of the groove TRm to close the groove TRm. As described above, the groove TRm is closed during the etching processing, so that it is possible to prevent the groove TRm from penetrating the stacked body LMs and interfering with the lower-layer structure.

According to the method for manufacturing the semiconductor storage device 1 of the embodiment, the width of the groove TRm is smaller than the width of the slits ST and STr. Thus, at the time of the collective processing of the groove TRm, the slits ST and STr, and the hole HL, the etching rate of the groove TRm can be reduced, and the groove TRm is prevented from penetrating the stacked body LMs before being closed.

According to the semiconductor storage device 1 of the embodiment, the beam BM is the groove TRm communicating with the plurality of contacts C4 and filled with the insulating layer 35. This prevents the beam BM from affecting the insulation performance between the plurality of contacts C4.

(Modification)

Next, a semiconductor storage device of a modification of the embodiment will be described with reference to FIGS. 5Aa, 5Ac to 5Ae, 5Ba, 5Bc to 5Be, 5Ca, and 5Cc to 5Ce. In the semiconductor storage device of the modification, the technique of closing the groove TRm is different from that in the embodiment described above.

Figure 5A:
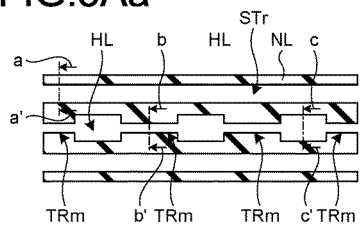
FIGS. 5Aa, 5Ac to 5Ae, 5Ba, 5Bc to 5Be, 5Ca, and 5Cc to 5Ce are views illustrating an example of a procedure of a method for manufacturing a semiconductor storage device according to a modification of the embodiment.
Figure 5B:
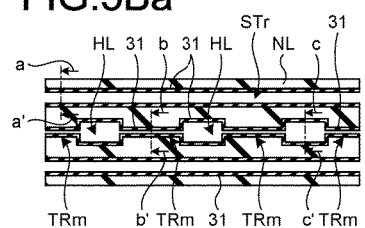
Figure 5C:
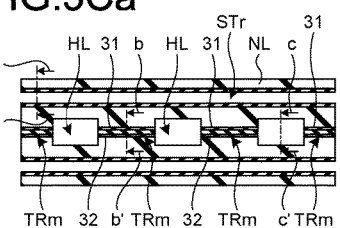
Figure 5A:
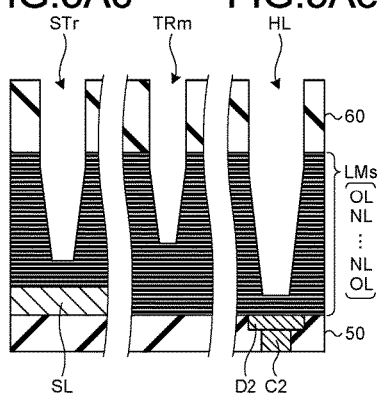
Figure 5B:
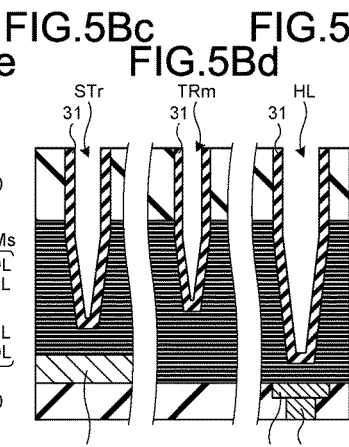
Figure 5C:
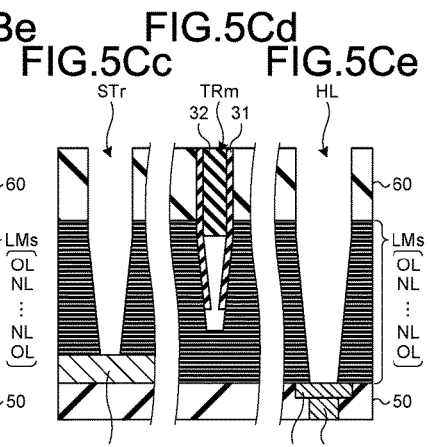

FIGS. 5Aa, 5Ac to 5Ae, 5Ba, 5Bc to 5Be, 5Ca, and 5Cc to 5Ce are views illustrating an example of a procedure of a method for manufacturing a semiconductor storage device according to a modification of the embodiment. FIGS. 5A to 5C illustrate how the process is advanced sequentially and correspond to the process of FIGS. 3A to 3C of the embodiment described above. The figures of FIGS. 5A to 5C added with "a" are partial transverse sectional views of the through contact region TPc in the process, and the figures added with "c" to "e" are longitudinal sectional views along line a-a', line b-b', and line c-c', respectively, in each of the figures added with "a". That is, the respective figures of each of FIGS. 5A to 5C added with "c" to "e" correspond to the respective figures of each of FIGS. 3A to 3C added with "c" to "e" in the embodiment described above.

Prior to the process illustrated in FIGS. 5A to 5C, as in the method for manufacturing the semiconductor storage device 1 of the embodiment described above, the process is performed up to the process of forming the pillar PL and the columnar portion HR in the stacked body LMs. The process illustrated in FIGS. 5A and 5B is the same as the process illustrated in FIGS. 3A and 3B of the embodiment described above.

However, as illustrated in FIGS. 5Ba and 5Bc to 5Be, on the sidewalls of the slit STr, the groove TRm, and the hole HL, the carbon layer 31 is formed, which is thinner than the carbon layer 31 formed by the process of FIGS. 3Ba, 3Bc to 3Be of the embodiment described above. As a result, the groove TRm remains open at the upper end without being blocked, similarly to the slit STr and the hole HL.

As illustrated in FIG. 5Ca and FIGS. 5Cc-5Ce, the etching processing for the stacked body LMs is resumed. At this time, a fluorocarbon (CxFy-based) gas such as $C_4F_8$, $C_4F_6$, or $C_5F_8$ is used as an etching gas, and etching conditions are used where a CxFy layer 32 is easily deposited in the slits STr, the groove TRm, and the holes HL.

The fluorocarbon-based gas dissociates into CxFy radicals (CxFy*) or the like in plasma during the etching processing and functions as an etchant. That is, such an etchant is adsorbed in the slit STr, the groove TRm, and the hole HL and receives the energy of the ion bombardment to proceed with the etching. However, some etchants are not subjected to the ion bombardment, and some or all of C (carbon) polymerizes and deposits as the CxFy layer 32 without contributing to the etching. For this reason, the CxFy layer 32 may also be referred to as a deposited layer, a deposition layer, or a fluorocarbon layer. However, this does not mean that the CxFy layer 32 is composed of a chemically classifiable fluorocarbon.

As described above, the etching processing is performed under the conditions where the CxFy layer 32 is easily deposited, so that the CxFy layer 32 as a sidewall layer is deposited in the groove TRm, which has a higher aspect ratio and the inside of which is hardly reached by ions, among the slit STr, the groove TRm, and the hole HL, and at least the upper portion of the groove TRm is closed by the CxFy layer 32.

Thereafter, the etching does not progress in the groove TRm, and although the depth reached by the groove TRm is slightly deeper than that before the etching processing is resumed, the etching is completed without the groove TRm penetrating the stacked body LMs. On the other hand, in the slit STr and the hole HL, the etching is continued, the slit STr reaches the source line SL, and the hole HL reaches the wiring D2, to complete the etching.

After the completion of the etching processing for the stacked body LMs, the mask layer 60, the carbon layer 31, and the CxFy layer 32 are removed by ashing.

Thereafter, the same process as in FIGS. 4C to 4H of the embodiment described above is performed, the barrier layer BR and the contacts C4 and LI are formed, and the upper-layer wiring is connected to the contacts C4 and LI and the pillar PL via the plug or the like.

As described above, the semiconductor storage device of the modification is manufactured.

In the modification as well, the same effect as those of the semiconductor storage device 1 and the method for manufacturing the semiconductor storage device 1 according to the embodiment described above is achieved.

According to the method for manufacturing the semiconductor storage device of the modification, the CxFy layer 32 generated by the etching processing is formed on the sidewalls of the plurality of holes HL and the sidewall of the groove TRm to close the groove TRm. As a result, it is not necessary to form the carbon layer 31 thick, the processing time can be shortened, and the cost can be reduced.

(Other Modifications)

In the embodiment and modification described above, the groove TRm has been closed by the carbon-containing layer such as the carbon layer 31 or the CxFy layer 32. However, the groove TRm may be closed by a silicon-containing layer such as an amorphous silicon layer or a metal-containing layer by CVD or the like. In this case, the metal-containing layer is preferably an insulating layer, for example, a metal oxide layer such as an $Al_2O_3$ layer. However, even when the conductive member remains in the groove TRm, the groove TRm reaches only a predetermined depth in the stacked body LMs, and the possibility of causing electrical conduction with other members is extremely low.

In the embodiment and the modification described above, the contact C4 has been formed as the columnar body penetrating the insulating region NR as the predetermined film. However, the technique of coupling the plurality of columnar bodies together by the beam is also applicable to other configurations. That is, the predetermined film is not limited to a stacked film such as the insulating region NR but may be made of one type of film, and the columnar body is not limited to the contact C4 but may be another member penetrating the predetermined film.

In the embodiment and the modification described above, the etching processing for forming the contact LI and the barrier layer BR as the second and first plate-like portions, together with the contact C4 as the columnar body, has been performed collectively. However, the technique of coupling the plurality of columnar bodies together by the beam is also applicable to other configurations. That is, the plate-like portion is not limited to the contact LI or the barrier layer BR but may be another member having a slit shape, having a relatively low aspect ratio, and penetrating the predetermined film.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for manufacturing a semiconductor storage device, the method comprising:
   forming a predetermined film;
   forming a plurality of holes penetrating the predetermined film;
   performing etching processing on the plurality of holes and a groove that couples the plurality of holes together with a width smaller than widths of the plurality of holes, to a predetermined depth of the predetermined film;

forming a sidewall layer on sidewalls of the plurality of holes and a sidewall of the groove to close the groove; and further performing etching processing on the plurality of holes to penetrate the predetermined film, wherein at a time of forming the predetermined film, forming the predetermined film as a first stacked body in which a plurality of first insulating layers and a plurality of second insulating layers are stacked alternately, and at a time of forming the plurality of holes penetrating the predetermined film, forming a pair of first slits and a pair of second slits to penetrate the first stacked body, the pair of first slits having a longitudinal direction along a surface of each of layers of the first stacked body and having a width larger than a width of the groove, the pair of second slits having a longitudinal direction in a first direction and having a width larger than the width of the groove at positions on both sides of the pair of first slits separated from the pair of first slits.

2. The method for manufacturing a semiconductor storage device according to claim 1, wherein at the time of forming the plurality of holes penetrating the predetermined film, causing the plurality of holes to reach positions deeper than the pair of first slits and the pair of second slits.

3. The method for manufacturing a semiconductor storage device according to claim 1, wherein at the time of forming the plurality of holes penetrating the predetermined film, causing the plurality of holes to reach wiring disposed below the first stacked body, and causing the pair of first slits and the pair of second slits to reach a source line located above the wiring.

* * * * *